United States Patent
Liu et al.

(10) Patent No.: US 7,590,214 B2
(45) Date of Patent: Sep. 15, 2009

(54) SHIFT REGISTER AND SHIFT REGISTER APPARATUS THEREOF

(75) Inventors: Chin-Wei Liu, Taipei (TW); Ya-Hsiang Tai, Hsinchu (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 12/022,101

(22) Filed: Jan. 29, 2008

(65) Prior Publication Data

US 2008/0279327 A1 Nov. 13, 2008

(30) Foreign Application Priority Data

May 9, 2007 (TW) ............................. 96116475 A

(51) Int. Cl.
*G11C 19/00* (2006.01)
(52) U.S. Cl. ............................. 377/64; 377/68; 377/70; 377/74; 377/77; 377/79
(58) Field of Classification Search ................. 377/64, 377/68–70, 74, 77–80
See application file for complete search history.

(56) References Cited

U.S. PATENT DOCUMENTS

| | | | |
|---|---|---|---|
| 5,105,187 A | 4/1992 | Plus et al. | |
| 5,222,082 A | 6/1993 | Plus | |
| 5,410,583 A | 4/1995 | Weisbrod et al. | |
| 6,064,713 A | 5/2000 | Lebrun et al. | |
| 6,300,928 B1 | 10/2001 | Kim | |
| 6,690,347 B2 | 2/2004 | Jeon et al. | |
| 6,970,530 B1 | 11/2005 | Wang et al. | |
| 7,038,653 B2 | 5/2006 | Moon | |
| 7,499,517 B2 * | 3/2009 | Lin et al. | ........................ 377/64 |
| 7,532,701 B2 * | 5/2009 | Moon | ............................ 377/68 |
| 2008/0273004 A1 * | 11/2008 | Osame et al. | ................ 345/100 |

* cited by examiner

*Primary Examiner*—Tuan Lam
(74) *Attorney, Agent, or Firm*—Jianq Chyun IP Office

(57) ABSTRACT

A shift register and a shift register apparatus are provided. The shift register includes a plurality of shift register apparatus, and each shift register apparatus comprises a pre-charge circuit, a pull-up circuit and a pull-down circuit. The pre-charge circuit is used for sampling an input signal according to a first clock signal and a second clock signal respectively and generate a first charging signal and a second charging signal respectively. The pull-up circuit is coupled to the pre-charge circuit. The pull-up circuit receives the third clock signal and the first charging signal to output an output signal accordingly. The pull-down circuit is coupled to the pre-charge circuit and the pull-up circuit. The pull-down circuit receives the fourth clock signal and the second charging signal to decide whether to couple the output signal to a common potential.

31 Claims, 9 Drawing Sheets

US 7,590,214 B2

SHIFT REGISTER AND SHIFT REGISTER APPARATUS THEREOF

CROSS-REFERENCE TO RELATED APPLICATION

This application claims the priority benefit of Taiwan application serial no. 96116475, filed on May 9, 2007. The entirety of the above-mentioned patent application is hereby incorporated by reference herein and made a part of this specification.

BACKGROUND OF THE INVENTION

1. Field of the Invention

The present invention generally relates to a shift register and a shift register apparatus thereof, and more particularly, to a shift register for avoiding an output voltage incapable of being completely charged due to a bias applied to a gate of an amorphous silicon thin film transistor (a-Si TFT) for a long time and a shift register apparatus thereof

2. Description of Related Art

In a condition of a predetermined panel processing, it is critical for configuring a circuit on a glass substrate to be used an a-Si TFT. Generally, a-Si TFTs can be divided into two types, P-type a-Si TFTs and N-type a-Si TFTs. The P-type a-Si TFT typically has a threshold voltage higher than that of an N-type a-Si TFT. Therefore, P-type a-Si TFTs are often considered as less convenient than N-type a-Si TFTs. As such, all N-type a-Si TFTs are more often to be formed when configuring a circuit on the glass substrate.

An all N-type a-Si TFT includes an inverter which is usually configured on the glass substrate. FIG. 1 is circuit of an inverter of a conventional all N-type a-Si TFT. Referring to FIG. 1, the circuit includes transistors 101 and 102, wherein VDD and GND represent a power source voltage and a ground voltage, respectively, and Vin and Vo represent input signals and output signals, respectively.

It can be learnt from FIG. 1, that a gate of the transistor 101 is directly coupled to the power source voltage VDD. However, such a bias configuration negatively affects the inverter circuit, in that if the gate of the a-Si TFT is applied with a direct current bias for a relative long time, the a-Si film will be degraded and incur many defects. In the meantime, a threshold voltage Vt thereof inevitably is significant. In this manner, in the circuit structure illustrated in FIG. 1, the threshold voltage Vt of the transistor 101 will shifts after a certain time of operation, so that a voltage of the output signals Vo can not be completely charged. Therefore, the inverter circuit is not suitable for long time operation.

Currently, a-Si TFTs have been used for fabricating shift register apparatus on glass substrates. Some technologies disclosed in related patents, such as U.S. Pat. Nos. 7,038,653, and 5,222,082, bypass the inverter structure as shown in FIG. 1 by sophisticated design. However, the problem of the shift of the threshold voltage of the a-Si TFT occurred after long time use has not yet been resolved. FIG. 2 is a circuit of a shift register apparatus disclosed in U.S. Pat. No. 7,038,653. As shown in FIG. 2, a transistor 201 of the inverter structure defined in the dashed frame 174 is being continuously applied with a bias voltage of VON, so that the transistor 201 would also have a problem of shift of the threshold voltage. This problem drastically shortens a lifetime of the shift register apparatus.

FIG. 3 shows a circuit of a shift register apparatus disclosed in U.S. Pat. No. 5,222,082. As shown in FIG. 3, there is no circuit structure similar to what is shown in FIG. 1. However, when the shift register apparatus is operated, residual charges on a node P2 cannot be discharged therefrom, and a transistor 301 also suffers a bias voltage for a relative long time. After the shift register apparatus is being operated for an excessively long time, a threshold voltage of the transistor 301 increases drastically, so that a voltage at an output terminal OUTPUT can not be completely charged, and thus the shift register apparatus may be out of use for quite a long time.

Several manufacturers have attempted to solve the problem of the shift of threshold voltage after a long time operation of a-Si TFTs. However, no effective solution has been found so far.

SUMMARY OF THE INVENTION

Accordingly, the present invention is directed to a shift register and a shift register apparatus thereof, wherein degradation of an a-Si thin film due to a gate of an a-Si TFT being applied with a bias voltage for a long time may be avoided, and improvement in the reliability of the a-Si TFT and stability of the circuit may be realized.

The present invention is also directed to a shift register and a shift register apparatus thereof, wherein a shift of a threshold voltage of an a-Si TFT may be avoided so that an output voltage can be completely charged.

The present invention is also directed to a durable shift register and a shift register apparatus adapted.

For at least the foregoing and other objects, the present invention provides a shift register apparatus. The shift register apparatus includes a pre-charge circuit, a pull-up circuit, and a pull-down circuit. The pre-charge circuit is adapted to sample input signals according to a first clock signal and a second clock signal, so as to generate a first charging signal and a second charging signal. The pull-up circuit is coupled to the pre-charge circuit, for receiving a third clock signal and the first charging signal, according to which output signals are outputted. The pull-down circuit is coupled with the pre-charge circuit and the pull-up circuit for receiving a fourth clock signal and the second charging signal, according to which whether or not the output signals should be coupled to a common potential may be determined. The input signal, the first clock signal and the second clock signal are enabled in a first period. The third clock signal is enabled in a second period, and the fourth clock signal is enabled in a third period. The second period occurs after the first period, and the third period occurs after the second period.

The present invention provides a shift register, which includes a first shift register apparatus and a second shift register apparatus. The first shift register apparatus is adapted for receiving an input signal, and the input signal is shifted according to a first clock signal, a second clock signal, a third clock signal and a fourth clock signal, so as to generate a first output signal. The second shift register apparatus is adapted for receiving the first output signal, and the first output signal is shifted according to the first clock signal, the second clock signal, a fifth clock signal, and a sixth clock signal, so as to generate a second output signal.

According to an embodiment of the present invention, the foregoing pre-charge circuit includes a first switch, a second switch, a first power storage device, and a second power storage device. The first switch has a first terminal, a second terminal and a control terminal. The first terminal of the first switch receives the input signal, and the control terminal receives the first clock signal, according to which whether or not to turn on is determined. The first power storage device has a first terminal and a second terminal. The first terminal of the first power storage device is coupled to the second terminal of the first switch for outputting the foregoing first charging signal, while the second terminal of the first power storage device is coupled to the common potential.

The second switch has a first terminal, a second terminal and a control terminal. The first terminal of the second switch receives the input signal, and the control terminal of the second switch receives the second clock signal, according to which whether or not to turn on is determined. The second power storage device has a first terminal and a second terminal. The first terminal of the second power storage device is coupled to the second terminal of the second switch for outputting the foregoing second charging signal, and the second terminal of the second power storage device is coupled to the common potential. In the present embodiment, the first switch and the second switch are all presented by N-type a-Si TFTs.

According to an embodiment of the present invention, the foregoing pull-up circuit of the shift register apparatus includes a third switch and a fourth switch. The third switch has a first terminal, a second terminal and a control terminal. The first terminal of the third switch is coupled to the pre-charge circuit for receiving a first pre-charge signal. The control terminal of the third switch receives a third clock signal to determine whether or not to turn on. The fourth switch has a first terminal, a second terminal and a control terminal. The first terminal of the fourth switch receives a third clock signal. The control terminal of the fourth switch is coupled to the second terminal of the third switch. The fourth switch determines whether or not to output the third clock signal according to signals received by the control terminal thereof, so as to form the output signal. In this embodiment, the third switch and the fourth switch are all embodied by N-type a-Si TFTs.

According to an embodiment of the present invention, the foregoing pull-down circuit of the shift register apparatus includes a fifth switch and a sixth switch. The fifth switch has a first terminal, a second terminal and a control terminal. The first terminal of the fifth switch is coupled to the pre-charge circuit for receiving the second pre-charge signal. The control terminal of the fifth switch receives fourth clock signal, which determines whether or not to turn on. The sixth switch has a first terminal, a second terminal and a control terminal. The first terminal of the sixth switch is coupled to the second terminal of the fourth switch. The second terminal of the sixth switch is coupled to the common potential. The control terminal of the sixth switch is coupled to the second terminal of the fifth switch. The sixth switch determines whether or not to turn on according to the signals received by the control terminal thereof, so as to couple the foregoing output signal to the common potential.

According to another embodiment of the present invention, the shift register apparatus further includes a first buffer circuit. The first buffer circuit is coupled to a common node shared by the pull-up circuit and the pull-down circuit. The common node is adapted for outputting the output signals. The first buffer circuit is adapted for buffering and improving a driving ability of the output signal.

The foregoing first buffer circuit includes a first switch, a second switch, and a power storage device. The first switch has a first terminal, a second terminal, and a control terminal. The first terminal of the first switch is coupled to a power source voltage. The control terminal of the first switch receives the output signals, which determines whether or not to turn on. The second terminal of the first switch functions as an output terminal of the first buffer circuit. The power storage device has a first terminal and a second terminal. The first terminal of the power storage device is coupled to the control terminal of the first switch. The second terminal of the power storage device is coupled to the second terminal of the first switch. The second switch has a first terminal, a second terminal and a control terminal. The first terminal of the second switch is coupled to the second terminal of the first switch. The second terminal of the second switch is coupled to the common potential. The control terminal of the second switch receives control pulse waves, which determines whether or not to turn on. Rising edges of the control pulse waves are falling edges of the output signals. In this embodiment, the first switch and the second switch of the first buffer circuit are all embodied by N-type a-Si TFTs.

According to another embodiment of the present invention, the shift register apparatus further includes a second buffer circuit. The second buffer circuit is coupled to the output terminal of the first buffer circuit for maintaining the output terminal of the first buffer circuit at a non-floating status.

The foregoing second buffer circuit includes a bias adjusting circuit and a third switch. The bias adjusting circuit is coupled to the output terminal of the first buffer circuit for generating bias signals according to an output of the first buffer circuit. The third switch has a first terminal, a second terminal, and a control terminal. The first terminal of the third switch is coupled to the output terminal of the first buffer circuit. The second terminal of the third switch is coupled to the common potential. The control terminal of the third switch receives the bias signals, which determines a degree to conduct.

The foregoing bias adjusting circuit includes a first impedance, a second impedance, a third impedance and a fourth switch. The first impedance has a first terminal and a second terminal. The first terminal of the first impedance is coupled to the power source voltage. The second impedance has a first terminal and a second terminal. The first terminal of the second impedance is coupled to the second terminal of the first impedance. The second terminal of the second impedance is coupled to the common potential. The third impedance has a terminal coupled to the common potential. The fourth switch has a first terminal, a second terminal, and a control terminal. The first terminal of the fourth switch is coupled to another terminal of the third impedance. The control terminal of the fourth switch is coupled to the output terminal of the first buffer circuit for determining whether or not to turn on according to the output of the first buffer circuit. The second terminal of the fourth switch is coupled to the first terminal of the second impedance for outputting the bias signals. In the embodiment, the first switch, the second switch of the first buffer circuit, and the third switch, the fourth switch of the second buffer circuit are all embodied by N-type a-Si TFTs.

According to another embodiment of the present invention, the shift register apparatus includes a buffer circuit that is equivalent to the second buffer circuit. The buffer circuit is coupled to the common node of the pull-up circuit and the pull-down circuit. The common node is adapted for outputting the output signals. The buffer circuit is adapted for transmitting the output signals, and maintaining the common node at a non-floating status.

According to an embodiment of the present invention, the first clock signal and the second clock signal are reverse to each other. Frequencies and duty cycle ratios of the third clock signals and the fourth clock signals are equal to a half of that of the first clock signal. A pulse wave enabling time of the third clock signal is equal to that of an odd numbered pulse wave of the first clock signal. A pulse wave enabling time of the fourth clock signal is equal to that of an even numbered pulse wave of the first clock signal. Frequencies and duty cycle ratios of the fifth clock signal and the sixth clock signal are equal to a half of that of the second clock signal. A pulse wave enabling time of the fifth clock signal is equal to that of an odd numbered pulse wave of the second clock signal. A pulse wave enabling time of the sixth clock signal is equal to that of an even numbered pulse wave of the second clock signal.

The present invention employs specific TFT (a-Si TFT) coupling relationship to avoid conventional flip-flop circuit structure. Incorporating with some particular clock pulses to control the on/off states of the a-Si TFTs, the present invention is capable of shifting input signals, while preventing a gate of the a-Si TFT from being applied with a bias for a long time. According to the present invention, not only the a-Si thin film of the a-Si TFT is not likely to be degraded improve the reliability of the a-Si TFT, but also the shift of the threshold voltage of the a-Si TFT can be minimized, so as to allow the output voltage to be completely charged. Therefore, the service life of the shift register apparatus can be effectively increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
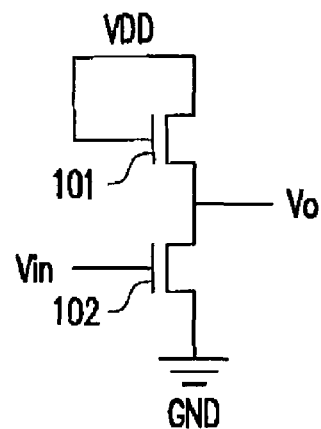
FIG. 1 is circuit of an inverter of a conventional all N-type a-Si TFT.
Figure 2:
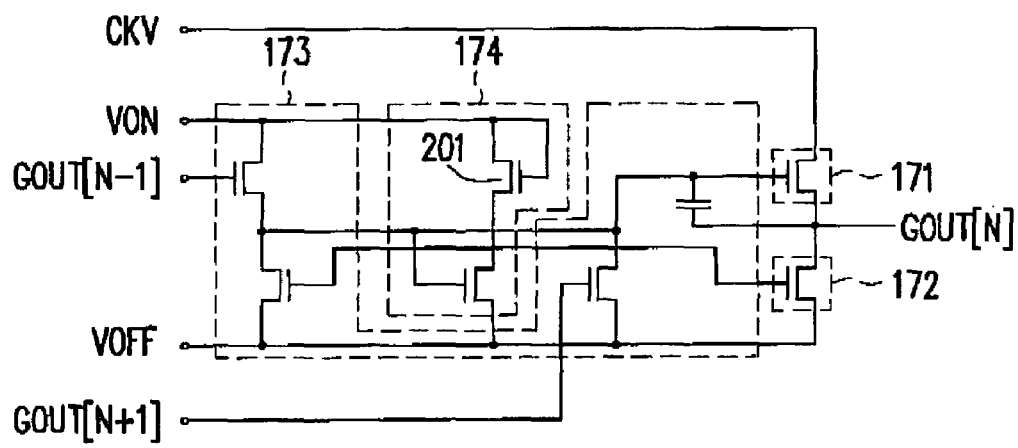
FIG. 2 is a circuit of a shift register apparatus disclosed in U.S. Pat. No. 7,038,653.
Figure 3:
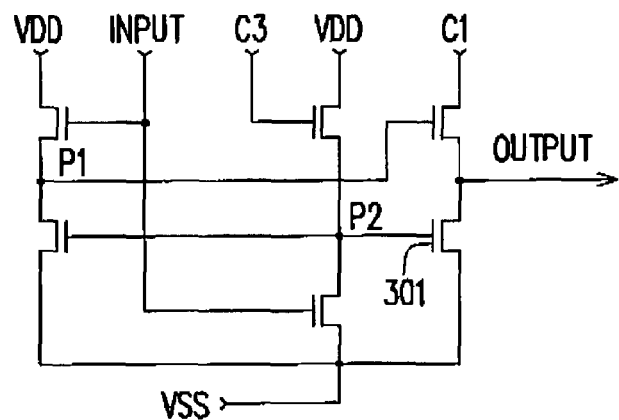
FIG. 3 is a circuit of a shift register apparatus disclosed in U.S. Pat. No. 5,222,082.

Reference will now be made in detail to the present preferred embodiments of the invention, examples thereof are illustrated in the accompanying drawings. Wherever possible, the same reference numbers are used in the drawings and the description to refer to the same or like parts.

Figure 4:
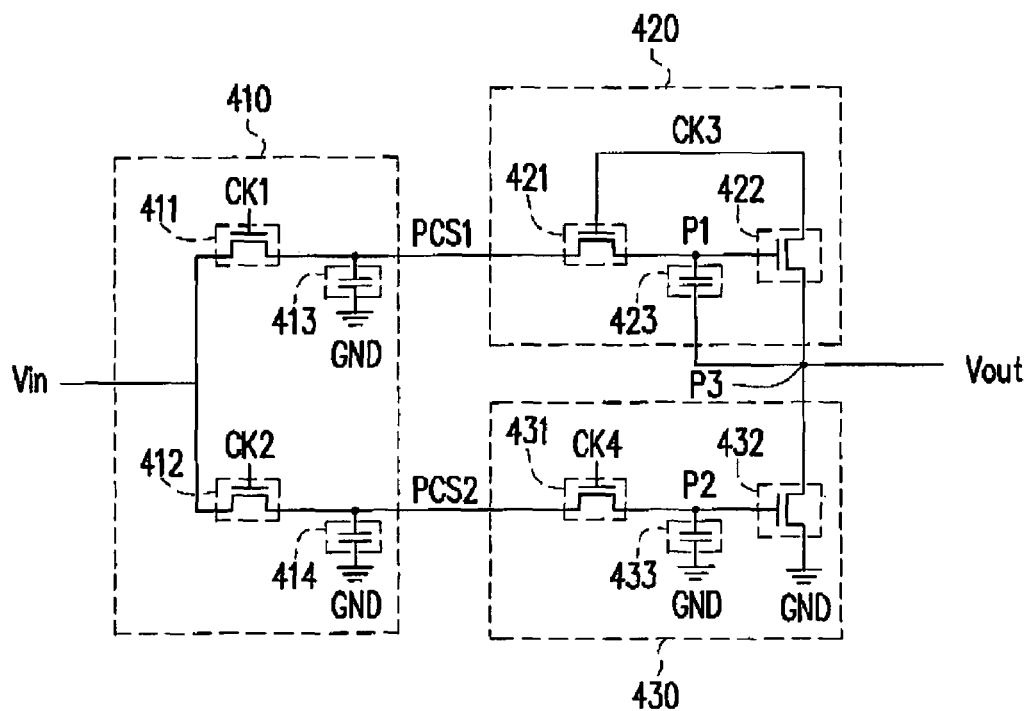
FIG. 4 is a circuit diagram of a shift register apparatus according to an embodiment of the present invention.

FIG. 4 is a circuit diagram of a shift register apparatus according to an embodiment of the present invention. Referring to FIG. 4, the shift register apparatus includes a pre-charge circuit 410, a pull-up circuit 420 and a pull-down circuit 430. The pre-charge circuit 410 is adapted to sample input signal Vin according to clock signals CK1 and CK2 for generating charging signal PCS1 and PCS2, respectively. The pull-up circuit 420 is coupled to the pre-charge circuit 410 for receiving a clock signal CK3 and the charging signal PCS1, so as to output an output signal Vout. The pull-down circuit 430 is coupled to the pre-charge circuit 410 and the pull-up circuit 420 for receiving clock signal CK4 and the charging signal PCS2 and determining whether or not to couple the output signal Vout to a common potential GND.

The pre-charge circuit 410 includes switches 411 and 412 and power storage devices 413 and 414. The switch 411 has a first terminal, a second terminal and a control terminal. The first terminal of the switch 411 receives the input signal Vin. The control terminal of the switch 411 receives the clock signal CK1, and thus determining whether or not to turn on. The power storage device 413 has a first terminal and a second terminal. The first terminal of the power storage device 413 is coupled to the second terminal of the switch 411 for outputting the charging signal PCS1. The second terminal of the power storage device 413 is coupled to the common potential GND.

The switch 412 has a first terminal, a second terminal and a control terminal. The first terminal of the switch 412 receives the input signal Vin. The control terminal of the switch 412 receives the clock signal CK2, so as to determine whether or not to turn on. The power storage device 414 has a first terminal and a second terminal. The first terminal of the power storage device 414 is coupled to the second terminal of the switch 412 for outputting the charging signal PCS2. The second terminal of the power storage device 414 is coupled to the common potential.

The pull-up circuit 420 includes switches 421 and 422, and power storage devices 423. The switch 421 has a first terminal, a second terminal and a control terminal. The first terminal of the switch 421 is coupled to the pre-charge circuit 410 for receiving the charging signal PCS1. The control terminal of the switch 421 receives the clock signal CK3, thus determining whether or not to turn on. The switch 422 has a first terminal, a second terminal, and a control terminal. The first terminal of the switch 422 receives the clock signal CK3. The control terminal of the switch 422 is coupled to the second terminal of the switch 421. The second switch determines whether or not to output the clock signals CK3 to form the output signal Vout according to signals received by the control terminal thereof. The power storage device 423 has a first terminal and a second terminal. The first terminal of the power storage device 423 is coupled to the control terminal of the switch 422, and the second terminal of the power storage device 423 is coupled to the second terminal of the switch 422.

The pull-down circuit 430 includes switches 431 and 432, and power storage device 433. The switch 433 has a first terminal, a second terminal, and a control terminal. The first terminal of the switch 431 is coupled to the pre-charge circuit 410 for receiving the charging signal PCS2. The control terminal of the switch 431 receives the clock signal CK4, and determines whether or not to turn on. The switch 432 has a first terminal, a second terminal and a control terminal. The first terminal of the switch 432 is coupled to the second terminal of the switch 422. The second terminal of the switch 432 is coupled to the common potential GND. The control terminal of the switch 432 is coupled to the second terminal of the switch 431. The switch 432 determines whether or not to turn on to couple the output signal Vout to the common potential GND according to the signals received by the control terminal thereof.

In this embodiment, the switches 411, 412, 421, 422, 431 and 432 are all N-type a-Si TFTs, each first terminal thereof serves as a source/drain, each second terminal thereof serves as another source/drain, and each control terminal thereof serves as a gate. All of the power storage devices in the embodiment are capacitors, each first terminal thereof serves as a terminal of the capacitor, and each second terminal thereof serves as another terminal of the capacitor.

Figure 5:
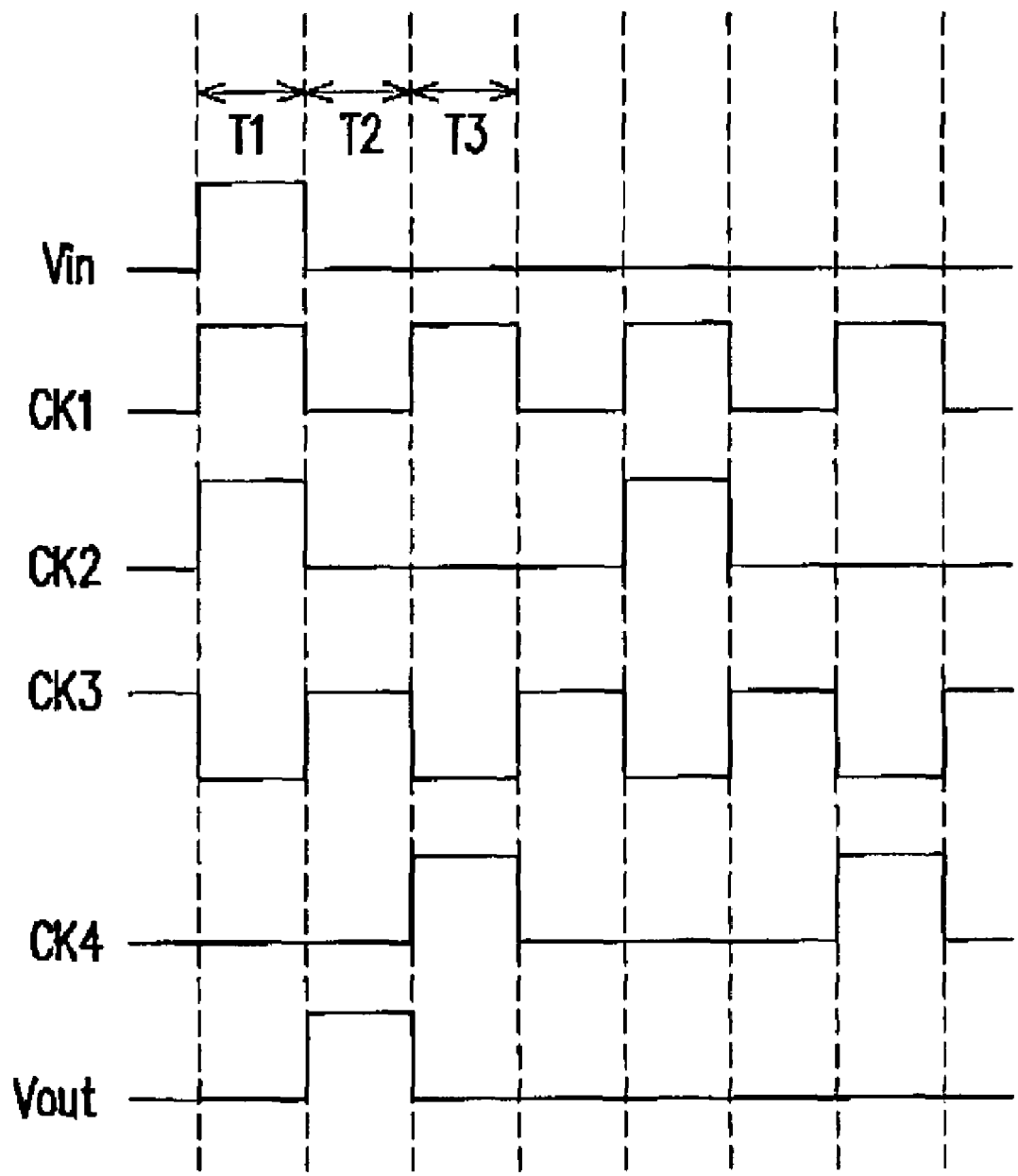
FIG. 5 is a diagram showing clock sequences of the signals of the circuit of FIG. 4.

FIG. 5 is a diagram showing clock sequences of the signals of the circuit of FIG. 4. Referring to FIGS. 4 and 5, if the input signals Vin enables in a first period T1, then the first clock signal CK1 and the second clock signal CK2 also enable in the first period T1 so as to turn on the switches 411 and 412 respectively, thus sampling the input signal Vin. In such a way, the input signal Vin charges the power storage device 413 via the switch 411 so as to generate the charging signal PCS1; charges the power storage device 414 via the switch 412 so as to generate the charging signal PCS2.

Therefore, the clock signal CK3 enables in a second period T2 to turn on the switch 421, so as to allow the charging signal PCS1 turn on the switch 422 via the switch 421. Therefore, the switch 422 outputs the clock signal CK3 and forms the output signal Vout. The clock signal CK4 enables in a third period T3 to turn on the switch 431, so as to allow the charging signal PCS2 turn on the switch 432 via the switch 431. Therefore, the output signal Vout is coupled to the common potential GND.

It should be noted that because the power storage devices 423 and 433 are responsible for providing voltages to the control terminals of the switches 422 and 432, i.e., gates of the N-type a-Si TFTs, in order to allow the N-type a-Si TFTs having enough voltages provided thereto, the capacitances of the power storage devices 423 and 433 must be practically much less than the capacitance of the power storage devices 413 and 414. Further, it should also be noted that the power storage device 423 has another function of allowing the voltage of the output signal Vout more completely charge. Because the power storage device 423 can couple parasitic capacitance occurring thereby leading to a coupling effect, thus enhancing the voltage at the control terminal of the switch 422. Accordingly, the switch obtains an enough channel width, which is called bootstrapping effect.

Figure 6:
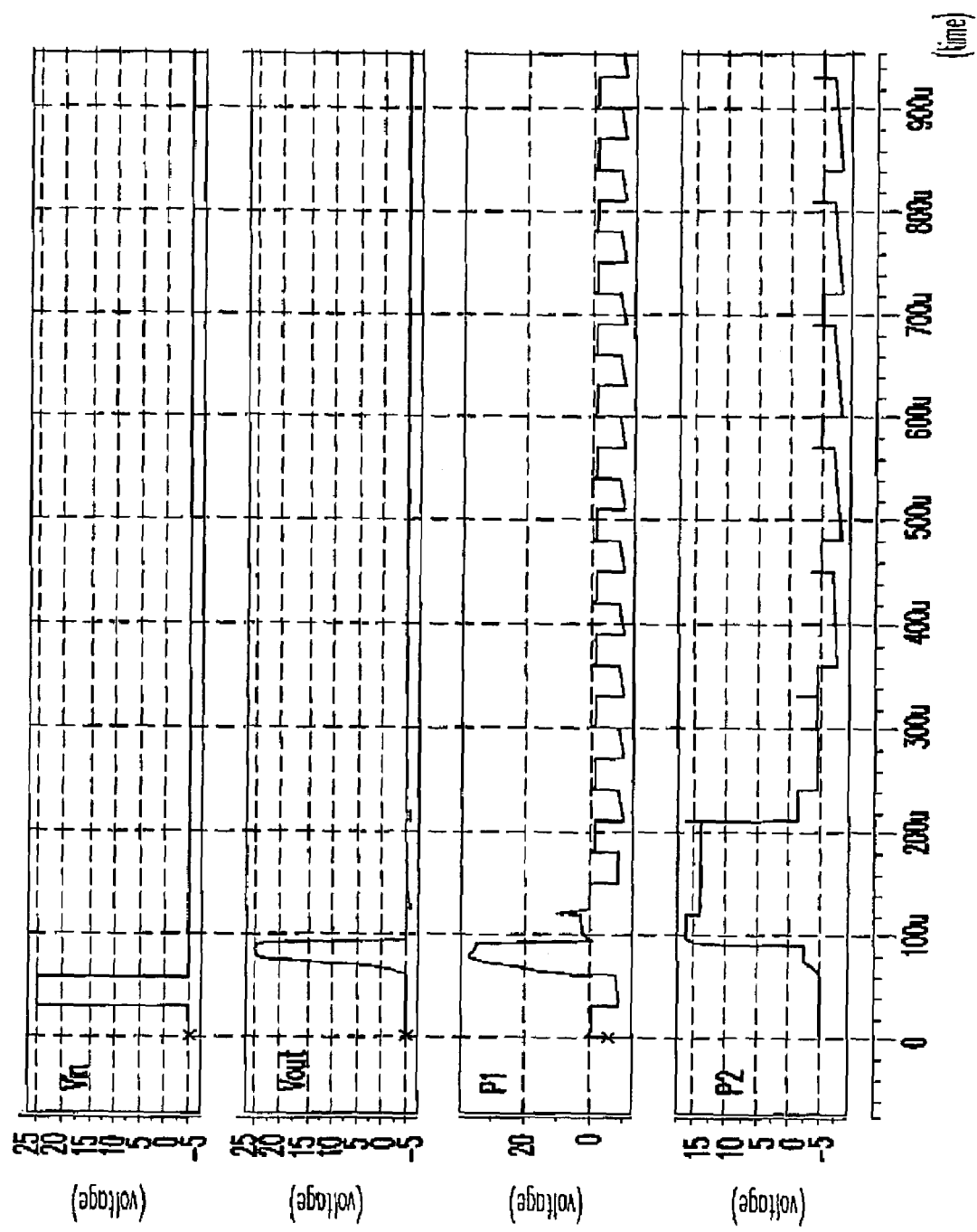
FIG. 6 is a signal simulation diagram of the circuit shown in FIG. 4.

FIG. 6 is a signal simulation diagram of the circuit as shown in FIG. 4. In FIG. 6, legends P1 and P2 correspond to voltage signals at nodes P1 and P2 of FIG. 4, respectively. It can be learnt from the simulation result shown in FIG. 6, voltage signals on nodes P1 and P2 all last for very short times. That indicates bias voltages applied to switches 422 and 432, i.e., N-type a-Si TFTs, lasting very short times. Therefore, it can be concluded that the present invention is suitable for significantly improving the reliability of the N-type a-Si TFTs, and thus improving the stability of the circuit using the same.

Figure 7:
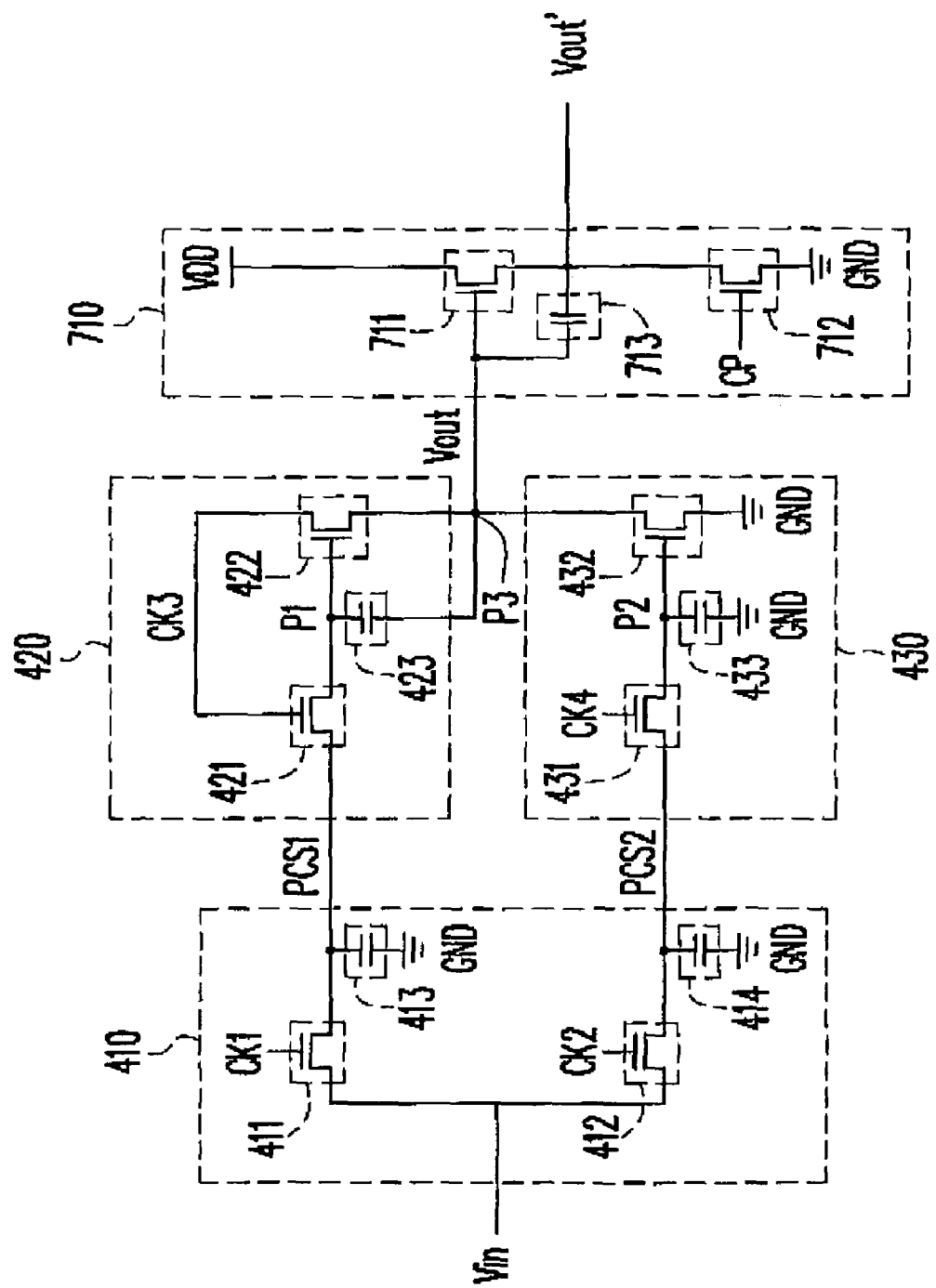
FIG. 7 is a circuit diagram of a shift register apparatus according to another embodiment of the present invention.

In order to drive more loads, so that the shift register apparatus can be operated with a higher frequency, a buffer circuit may be added as shown in FIG. 7. FIG. 7 is a circuit diagram of a shift register apparatus according to another embodiment of the present invention. Referring to FIG. 7, a buffer circuit 710 is coupled to a common node P3 shared by the pull-up circuit 420 and the pull-down circuit 430, for buffering and enhancing the driving ability of the output signal Vout.

The buffer circuit 710 includes switches 711 and 712, and a power storage device 713. The switch 711 has a first terminal, a second terminal and a control terminal. The first terminal of the switch 711 is coupled to a power source voltage VDD. The control terminal of the switch 711 receives the output signal Vout, for determining whether or not to turn on thereby. The second terminal of the switch 711 also functions as an output terminal 714 of the buffer circuit 710, for outputting the output signal Vout'. The power storage device 713 includes a first terminal and a second terminal. The first terminal of the power storage device 713 is coupled to the control terminal of the switch 711. The second terminal of the power storage device 713 is coupled to the second terminal of the switch 711. The second switch 712 has a first terminal, a second terminal and a control terminal. The first terminal of the second switch 712 is coupled to the second terminal of the switch 711. The second terminal of the second switch 712 is coupled to the common potential GND. The control terminal of the switch 712 receives a control pulse wave CP for determining whether or not to turn on. Rising edges of the control pulse wave are falling edges of the output signal Vout.

In the current embodiment, the switches 711 and 712 are embodied with N-type a-Si TFTs. Each first terminal of the switches serves as a source/drain of a corresponding N-type a-Si TFT, and each second terminal of the switches servers as another source/drain of the corresponding N-type a-Si TFT, and each control terminal of the switches serves as a gate of the corresponding N-type a-Si TFT. The power storage device 713 is embodied by a capacitor hereby. The first terminal of the power storage device 713 serves as a terminal of the capacitor, and the second terminal of the power storage device serves as another terminal of the capacitor.

According to an aspect of the embodiment, a period in which the output signal Vout assumes a high level (logic 1) is also a period that the switch 711 is turn on. Since the rising edges of the control pulse wave CP are the falling edges of the output signal Vout, there is almost no phase difference between output signal Vout' of the buffer circuit 710 and the output signal Vout. Therefore, the output signal Vout' of the buffer circuit 710 can be substantially considered as the output signal Vout, while a level of the output signal Vout' of the buffer circuit 710 is closer to the level of the power source voltage VDD, which is favourable to drive more loads, and thus allowing the shift register apparatus to be operated under higher frequencies. The power storage device 713 is functionally similar with the power storage device 423, and is not to be iterated hereby.

Figure 8:
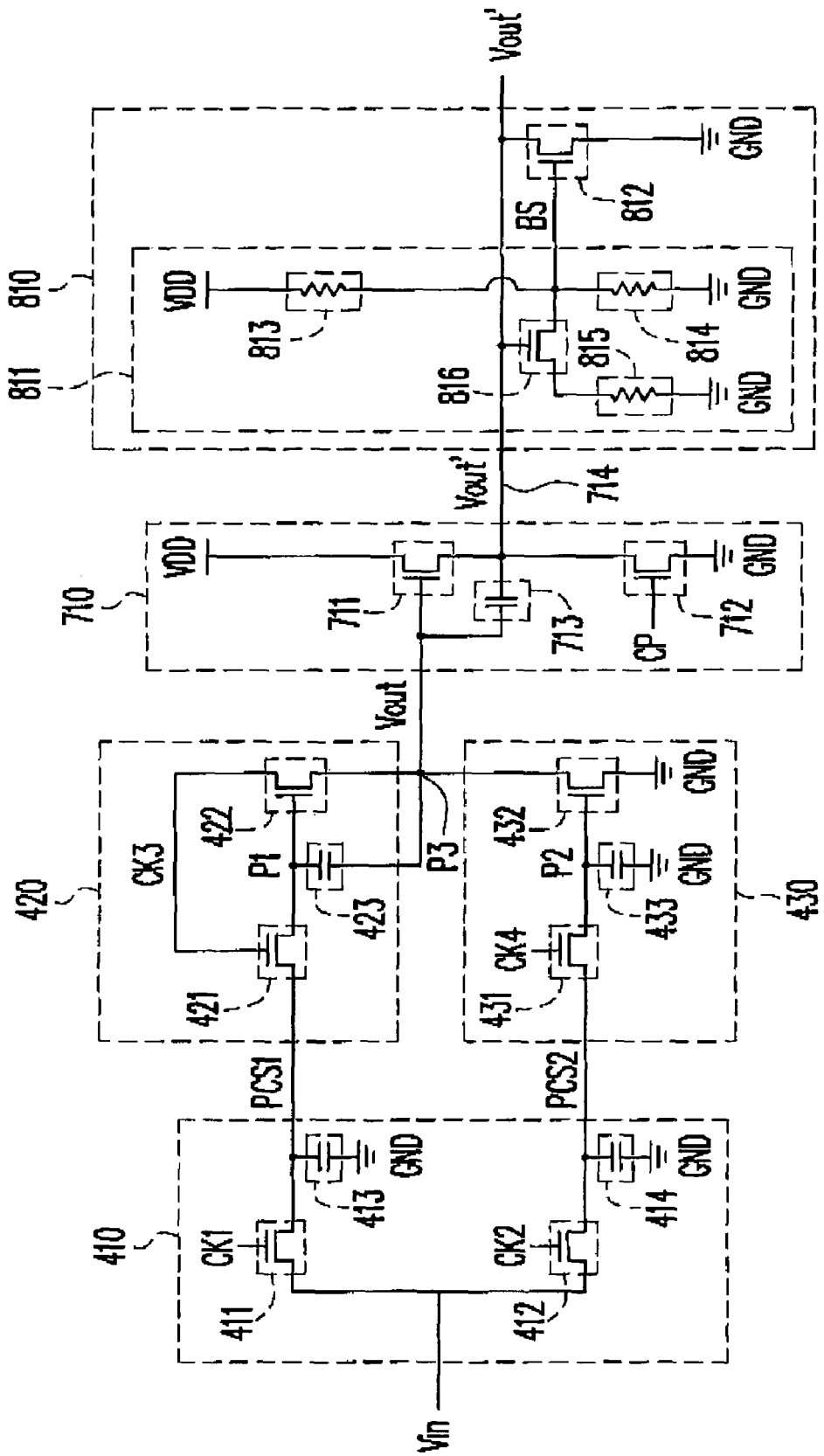
FIG. 8 is a circuit diagram of a shift register apparatus according to yet another embodiment of the present invention.

In order to prevent the output signal Vout' of the output terminal 714 of the buffer circuit 710 from staying at a floating status when they are at a low level (logic 0) which may cause noises by chance transmitted into the shift register apparatus by the output terminal 714, users may further employ another buffer circuit as shown in FIG. 8 into the shift register apparatus as shown in FIG. 7. FIG. 8 is a circuit diagram of a shift register apparatus according to still another embodiment of the present invention. Referring to FIG. 8, the buffer circuit 810 is adapted for preventing the output terminal 714 of the buffer circuit 710 from staying at a floating status.

The buffer circuit 810 includes a bias adjusting circuit 811 and a switch 812. The bias adjusting circuit 811 is coupled to the output terminal 714 of the buffer circuit 710 for generating bias signal BS according to the output signal Vout' of the buffer circuit 710. The switch 812 has a first terminal, a second terminal and a control terminal. The first terminal of the switch 812 is coupled to the output terminal 714, and the second terminal of the switch 812 is coupled to the common potential GND. The control terminal of the switch 812 receives the bias signal BS for determining whether or not to turn on.

The bias adjusting circuit 811 includes impedances 813, 814 and 815 and a switch 816. The impedance 813 has a first terminal and a second terminal. The first terminal of the resistor 813 is coupled to the power source voltage VDD. The impedance 814 has a first terminal and a second terminal. The first terminal of the impedance 814 is coupled to the second terminal of the impedance 813. The second terminal of the impedance 814 is coupled to the common potential GND. The impedance 815 has a terminal coupled to the common potential GND. The switch 816 has a first terminal, a second terminal and a control terminal. The first terminal of the switch 816 is coupled to another terminal of the impedance 815. The control terminal of the switch 816 is coupled to the output terminal 714 of the buffer circuit 710 for determining whether or not to turn on according to the output signal Vout' outputted from the buffer circuit 710. The second terminal of the switch 816 is coupled to the first terminal of the impedance 814 for outputting the bias signal BS.

In the current embodiment, both of the switches 812 and 816 are embodied with N-type a-Si TFTs. Each first terminal of the switches is a source/drain of a corresponding N-type a-Si TFT, and each second terminal of the switches is another source/drain of the corresponding N-type a-Si TFT, and each control terminal of the switches is a gate of the corresponding N-type a-Si TFT. The impedances 813, 814, and 815 are all embodied with resistors, in which each first terminal of the impedances serves as a terminal of the resistors, and each second terminal of the impedances serves as another terminal of the resistors.

According to the embodiment of the present invention, by properly adjusting a proportion between resistances of the impedances 813 and 814, the control terminal of the switch 812, i.e., the gate of the a-Si TFT, can be maintained at a low level when the buffer circuit 710 does not output the output signal Vout'. For example, a voltage level of the control terminal of the switch 812 can be dropped from 30 volts to 10 volts by adjusting the resistance value of the impedance 813. In such a way, a smaller channel can be obtained according to the low voltage. The ambient noise is therefore transmitted to the common potential GND, and would not disturb normal operation of the shift register apparatus. When the buffer circuit 710 outputs the output signal Vout', the switch 816 turn on so that the impedances 815 and 814 are connected in parallel resulting in a smaller resistance. Accordingly, the channel of the switch 812 becomes even smaller, which is almost like at a turn-off status without affecting the normal output of the output signal Vout'.

Because the bias voltage of the control terminal, i.e., the gate of the a-Si TFT has dropped from 30 volts to 10 volts, a shift of the threshold voltage of the switch 812 is very small. In fact, although the quantity of the shift of the threshold voltage is determined by processing of manufacturers of the a-Si TFTs, and different TFT films corresponds to different shift quantity, it has be testified by experimental documents that when a bias voltage is maintained at a gate of an a-Si TFT, regardless of the processing of the a-Si TFT and the films thereof, and even though the bias voltage lasts for 105 seconds, only a shift of about 0.1-0.2 volt occurs. Further, it should be noted that a size of the switch 816 must be designed large enough because the voltage at the control terminal of the switch 812 is hard to decrease, which may lead to a voltage drop of the output signal Vout'.

Figure 9:
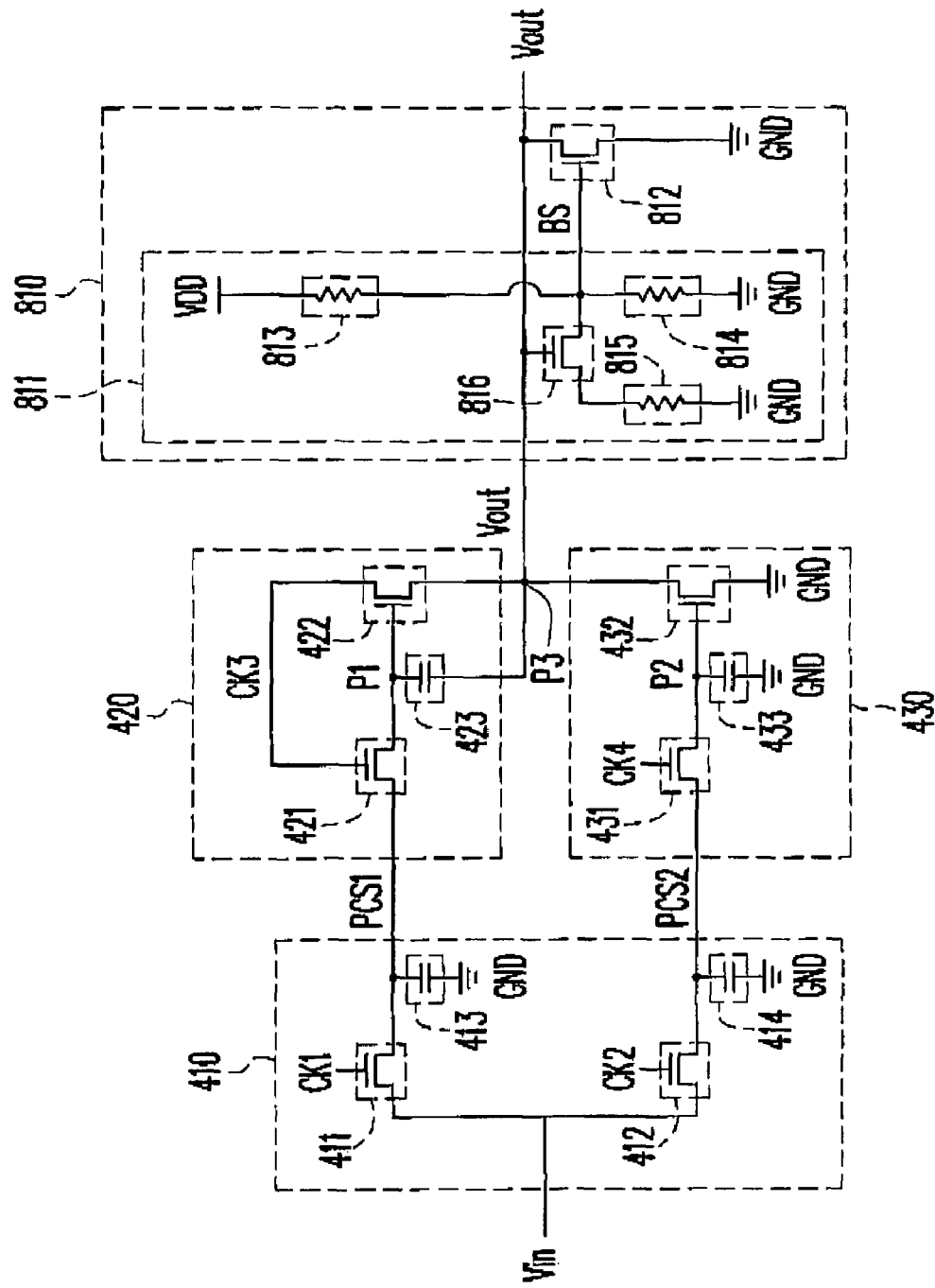
FIG. 9 is a circuit diagram of a shift register apparatus according to yet embodiment of the present invention.

Of course, if the driving ability of the output signal Vout is sufficient, while an anti-noise ability of the shift register apparatus requires improvement, the use of the buffer circuit 710 may be omitted and instead the buffer circuit 810 may be added as shown in FIG. 9. FIG. 9 is a circuit diagram of a shift register apparatus according to yet another embodiment of the present invention. Referring to FIG. 9, the buffer circuit 810 is coupled to a common node P3 shared by a pull-up circuit 420 and a pull-down circuit 430 for transmitting output signal Vout, and maintaining the common node P3 at a non-floating status. The operation of the shift register apparatus is similar to that discussed in the above embodiment and it is not repeated.

As taught in the foregoing embodiments, those of ordinary skill in the art should be aware that multi-stage output signals can be obtained by serially connecting a plurality of shift register apparatus as described above, as shown in FIG. 10.

Figure 10:
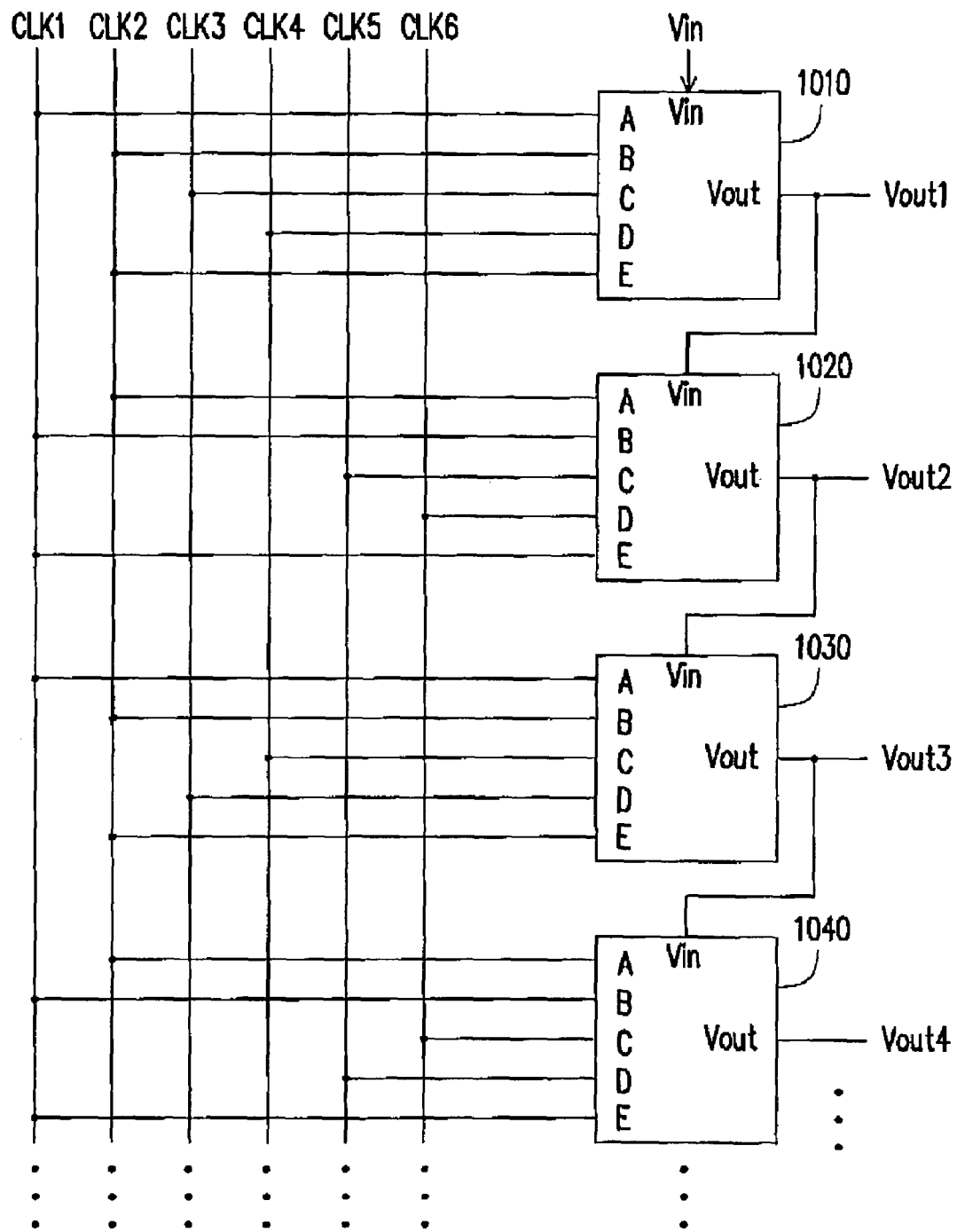
FIG. 10 is block diagram illustrating a shift register according to an embodiment of the present invention.

FIG. 10 is block diagram illustrating a shift register according to an embodiment of the present invention. FIG. 10 illustrates four former stages of shift register apparatus of the shift register. Referring to FIG. 10 and FIG. 4, each of the shift register apparatus including an input terminal A represents the control terminal of the switch 411, an input terminal B represents the control terminal of the switch 421, an input terminal C represents the control terminal of the switch 412, an input terminal D represents the control terminal of the switch 431, and an input terminal E represents the first terminal of the switch 422. Input terminals of other stages can be learnt by referring to the above description.

Again referring to FIG. 10, a first shift register apparatus 1010 receives input signal Vin, and shifts the input signal Vin according to a first clock signal CLK1, a second clock signal CLK2, a third clock signal CLK3 and a fourth clock signal CLK4, so as to generate first output signal Vout1. A second shift register apparatus 1020 receives the first output signal Vout1, and shifts the first output signal Vout1 according to the first clock signal CLK1, the second clock signal CLK2, a fifth clock signal CLK5, a sixth clock signal CLK6, so as to generate second output signal Vout2.

A third shift register apparatus 1030 receives the second output signal Vout2, and shifts the second output signal Vout2 according to the first clock signal CLK1, the second clock signal CLK2, a third clock signal CLK3,and a fourth clock signal CLK4, so as to generate third output signal Vout3. A fourth shift register apparatus 1040 receives the third output signal Vout3, and shifts the third output signal Vout3 according to the first clock signal CLK1, the second clock signal CLK2, a fifth clock signal CLK5 and a sixth clock signal CLK6, so as to generate fourth output signal Vout4.

Figure 11:
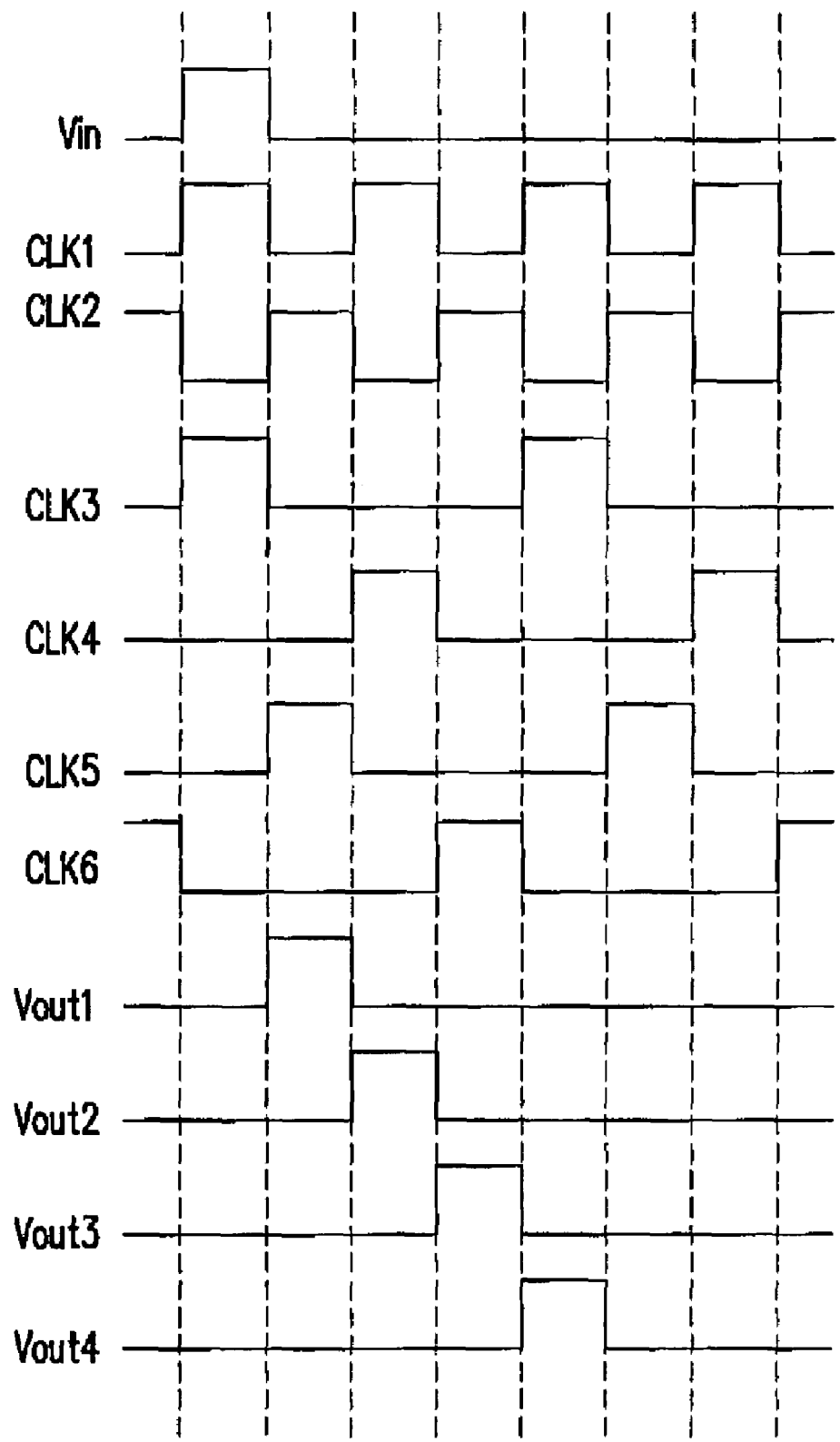
FIG. 11 illustrates clock signals of FIG. 10, and clock sequences of the output signals of the four former stages of the shift register apparatuses.

FIG. 11 illustrates clock signals of FIG. 10, and clock sequences of the output signals of the four former stages of the shift register apparatuses. Referring to FIG. 11, the first clock signal CLK1 and the second clock signal CLK2 are converse each other. Frequencies and duty cycle ratios of the third clock signal CLK3 and the fourth clock signal CLK4 are equal to a half of that of the first clock signal CLK1. A pulse wave enabling time of the third clock signal CLK3 is equal to that of an odd numbered pulse wave of the first clock signal CLK1. A pulse wave enabling time of the fourth clock signal CLK4 is equal to that of an even numbered pulse wave of the first clock signal CLK1.

Frequencies and duty cycle ratios of the fifth clock signal CLK5 and the sixth clock signal CLK6 are equal to a half of that of the second clock signal CLK2. A pulse wave enabling time of the fifth clock signal CLK5 is equal to that of an odd numbered pulse wave of the second clock signal CLK2. A pulse wave enabling time of the sixth clock signal CLK6 is equal to that of an even numbered pulse wave of the second clock signal CLK2. In FIG. 11, Vout1, Vout2, Vout3, and Vout4 respectively represent the first output signal, the second output signal, the third output signal, and the fourth output signal.

Clock signal types of the stages of shift register apparatus after the fourth shift register apparatus 1040 circularly repeat the sequence of the clock signal types of the first shift register apparatus 1010, the second shift register apparatus 1020, the third shift register apparatus 1030 and the fourth shift register apparatus 1040, starting from a fifth shift register apparatus (not shown) and taking four shift register apparatuses as a cycle. However, it should be noted that the control pulse wave CP required by each shift register apparatus can use an output signal outputted from a stage of shift register apparatus next thereto, and designing the control pulse wave CP is not a must.

For the purpose of illustration, the foregoing embodiments are embodied with N-type a-Si TFTs. This is assumed that the present invention is likely going to be applied on a glass substrate. However, it should be noted, in other environments which do not strictly require a-Si TFTs, switches discussed in the foregoing embodiments can also be ordinary N-type metal-oxide-semiconductor transistors.

In summary, the present invention employs specific TFT (a-Si TFT) coupling relationship to avoid conventional flip-flop circuit structure. Incorporating with some particular clock pulses to control the on/off states of the a-Si TFTs, the present invention is capable of shifting input signals, while preventing a gate of the a-Si TFT from being applied with a bias for a long time. According to the present invention, not only the a-Si thin film of the a-Si TFT is not likely to be degraded to improve the reliability of the a-Si TFT, but also the shift of the threshold voltage of the a-Si TFT can be minimized, so as to allow the output voltage to be completely charged. Therefore, the service life of the shift register apparatus may be effectively promoted.

Further, only six TFTs are required for operating the shift register apparatus. Thus, the layout is simple and the disadvantages of complicated circuitries of prior patents, e.g., U.S. Pat. Nos. 6,064,713, 5,105,187, 5,410,583, and 6,970,530, may be overcome. Furthermore, the shift register and the shift register apparatus thereof drastically decrease time of applying bias voltage on the a-Si TFTs, so that the reliability of the a-Si TFTs can be significantly improved. Thus, the disadvantages of prior patents of U.S. Pat. Nos. 7,038,653, 5,222,082, 6,690,347, and 6,970,530, i.e., always having at least one a-Si TFT being applied with a bias voltage for a relative long time, may be overcome.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register apparatus, comprising:
a pre-charge circuit, for sampling an input signal according to a first clock signal and a second clock signal to generate a first charging signal and a second charging signal;
a pull-up circuit, coupled to the pre-charge circuit, for receiving a third clock signal and the first charging signal and outputting an output signal accordingly; and
a pull-down circuit, coupled to the pre-charge circuit and the pull-up circuit, for receiving a fourth clock signal and the second charging signal and determining whether or not to couple the output signal to a common potential accordingly,
wherein the input signal, the first clock signal, the second clock signal are enabled in a first period, the third clock signal is enabled in a second period, the fourth clock signal is enabled in a third period, and the second period occurs after the first period, and the third period occurs after the second period.

2. The shift register apparatus according to claim 1, wherein the pre-charge circuit comprises:

a first switch having a first terminal, a second terminal and a control terminal, wherein the first terminal of the first switch receives the input signal, and the control terminal receives the first clock signal to determine whether or not to turn on;
a first power storage device having a first terminal and a second terminal, wherein the first terminal of the first power storage device is coupled to the second terminal of the first switch for outputting the first charging signal, and the second terminal of the first power storage device is coupled to the common potential;
a second switch having a first terminal, a second terminal and a control terminal, wherein the first terminal of the second switch receives the input signal, and the control terminal of the second switch receives the second clock signal to determine whether or not to turn on; and
a second power storage device having a first terminal and a second terminal, wherein the first terminal of the second power storage device is coupled to the second terminal of the second switch to output the second charging signal, and the second terminal of the second power storage device is coupled to the common potential.

3. The shift register apparatus according to claim 2, wherein each of the first switch and the second switch comprise an N-type metal oxide semiconductor (NMOS) transistor, wherein a source/drain thereof serves as the first terminal of the first switch and the first terminal of the second switch; another source/drain thereof serves as the second terminal of the first switch and the second terminal of the second switch; and a gate thereof serves as the control terminal of the first switch and the control terminal of the second switch.

4. The shift register apparatus according to claim 2, wherein each of the first switch and the second switch comprise an N-type amorphous silicon (a-Si) TFT, wherein a source/drain thereof serves as the first terminal of the first switch and the first terminal of the second switch; another source/drain thereof serves as the second terminal of the first switch and the second terminal of the second switch; and a gate thereof serves as the control terminal of the first switch and the control terminal of the second switch.

5. The shift register apparatus according to claim 2, wherein each of the first power storage device and the second power storage device comprises a capacitor, two terminals thereof serve as the first terminal and the second terminal of the first power storage device respectively and serve as the first terminal and the second terminal of the second power storage device respectively.

6. The shift register apparatus according to claim 1, wherein the pull-up circuit of the shift register apparatus comprises:
a third switch having a first terminal, a second terminal and a control terminal, wherein the first terminal of the third switch is coupled to the pre-charge circuit to receive the first charging signal and the control terminal of the third switch receives the third clock signal to determine whether or not to turn on; and
a fourth switch having a first terminal, a second terminal and a control terminal, wherein the first terminal of the fourth switch receives the third clock signal; the control terminal of the fourth switch is coupled to the second terminal of the third switch; and the fourth switch determines whether or not to output the third clock signal according to signals received by the control terminal thereof, so as to form the output signal.

7. The shift register apparatus according to claim 6, wherein each of the third switch and the fourth switch comprise an N-type metal oxide semiconductor (NMOS) transistor, wherein a source/drain thereof serves as the first terminal of the third switch and the first terminal of the fourth switch, another source/drain thereof serves as the second terminal of the third switch and the second terminal of the fourth switch and a gate thereof serves as the control terminal of the third switch and the control terminal of the fourth switch.

8. The shift register apparatus according to claim 6, wherein each of the third switch and the fourth switch comprise an N-type amorphous silicon (a-Si) TFT, wherein a source/drain thereof serves as the first terminal of the third switch and the first terminal of the fourth switch, another source/drain thereof serves as the second terminal of the third switch and the second terminal of the fourth switch, and a gate thereof serves as the control terminal of the third switch and the control terminal of the fourth switch.

9. The shift register apparatus according to claim 6, wherein the pull-up circuit further comprises:
a third power storage device, having a first terminal coupled to the control terminal of the fourth switch and a second terminal coupled to the second terminal of the fourth switch.

10. The shift register apparatus according to claim 9, wherein the third power storage device comprises a capacitor having two terminals respectively serving as the first terminal and the second terminal of the third power storage device.

11. The shift register apparatus according to claim 1, wherein the pull-down circuit of the shift register apparatus comprises:
a fifth switch having a first terminal, a second terminal and a control terminal, wherein the first terminal of the fifth switch is coupled to the pre-charge circuit for receiving the second charging signal and the control terminal receives the fourth clock signal to determine whether or not to turn on;
a sixth switch having a first terminal, a second terminal and a control terminal, wherein the first terminal of the sixth switch is coupled to the second terminal of the fourth switch, the second terminal of the sixth switch is coupled to the common potential, the control terminal of the sixth switch is coupled to the second terminal of the fifth switch, and the sixth switch determines whether or not to turn on according to signals received by the control terminal thereof, so as to couple the output signal to the common potential.

12. The shift register apparatus according to claim 11, wherein each of the fifth switch and the sixth switch comprise an N-type metal oxide semiconductor (NMOS) transistor, wherein a source/drain thereof serves as the first terminal of the fifth switch and the first terminal of the sixth switch, another source/drain thereof serves as the second terminal of the fifth switch and the second terminal of the sixth switch, and a gate thereof serves as the control terminal of the fifth switch and the control terminal of the sixth switch.

13. The shift register apparatus according to claim 11, wherein each of the fifth switch and the sixth switch comprise an N-type amorphous silicon (a-Si) TFT, wherein a source/drain thereof serves as the first terminal of the fifth switch and the first terminal of the sixth switch, another source/drain thereof serves as the second terminal of the fifth switch and the second terminal of the sixth switch, and a gate thereof serves as the control terminal of the fifth switch and the control terminal of the sixth switch.

14. The shift register apparatus according to claim 11, wherein the pull-down circuit comprises:
a fourth power storage device, having a first terminal coupled to the control terminal of the sixth switch and a second terminal coupled to the common potential.

15. The shift register apparatus according to claim 14, wherein the fourth power storage device comprises a capacitor having two terminals respectively serving as the first terminal and the second terminal of the fourth power storage device.

16. The shift register apparatus according to claim 1, wherein the first clock signal and the third clock signal are reverse to each other, and frequencies and duty cycle ratios of the second clock signal and the fourth clock signal are equal to a half of that of the first clock signal.

17. The shift register apparatus according to claim 1 further comprising:
a buffer circuit, coupled to a common node shared by the pull-up circuit and the pull-down circuit, wherein the common node outputs the output signal and the buffer circuit transmits the output signal and maintains the common node at a non-floating status.

18. The shift register apparatus according to claim 17, wherein the buffer circuit further comprises:
a bias adjusting circuit, coupled to the common node, for generating a bias signal according to the output signal; and
a first switch having a first terminal, a second terminal, and a control terminal, wherein the first terminal of the first switch is coupled to the common node, the second terminal of the first switch is coupled to the common potential and the control terminal of the first switch receives the bias signal to determine a degree to conduct.

19. The shift register apparatus according to claim 18, wherein the bias adjusting circuit comprises:
a first impedance, having a first terminal and a second terminal, wherein the first terminal of the first impedance is coupled to a power source voltage;
a second impedance having a first terminal coupled to the second terminal of the first impedance and a second terminal coupled to the common potential;
a third impedance having a terminal coupled to the common potential; and
a second switch having a first terminal coupled to another terminal of the third impedance, a second terminal coupled to the first terminal of the second impedance to output the bias signal and a control terminal coupled to the common node to determine whether or not to turn on according to the output signal.

20. The shift register apparatus according to claim 19, wherein each of the first switch and the second switch comprise an N-type metal oxide semiconductor (NMOS) transistor, wherein a source/drain thereof serves as the first terminal of the first switch and the first terminal of the second switch, another source/drain thereof serves as the second terminal of the first switch and the second terminal of the second switch, and a gate thereof serves as the control terminal of the first switch and the control terminal of the second switch.

21. The shift register apparatus according to claim 19, wherein each of the first switch and the second switch comprise an N-type amorphous silicon (a-Si) TFT, wherein a source/drain thereof serves as the first terminal of the first switch and the first terminal of the second switch, another source/drain thereof serves as the second terminal of the first switch and the second terminal of the second switch, and a gate thereof serves as the control terminal of the first switch and the control terminal of the second switch.

22. The shift register apparatus according to claim 1 further comprising:
a first buffer circuit, coupled to a common node shared by the pull-up circuit and the pull-down circuit, wherein the common node outputs the output signal, and the first buffer circuit buffers to increase a driving ability of the output signals.

23. The shift register apparatus according to claim 22, wherein the first buffer circuit comprises:
a first switch, having a first terminal coupled to a power source voltage, a second terminal serving as an output terminal of the first buffer circuit and a control terminal for receiving the output signal to determine whether or not to turn on;
a power storage device having a first terminal coupled to the control terminal of the first switch and a second terminal coupled to the second terminal of the first switch; and
a second switch having a first terminal coupled to the second terminal of the first switch, a second terminal coupled to the common potential and a control terminal for receiving a control pulse waves to determine whether or not to turn on, wherein an rising edge of the control pulse wave is a falling edge of the output signal.

24. The shift register apparatus according to claim 23, wherein each of the first switch and the second switch comprise an N-type metal oxide semiconductor (NMOS) transistor, wherein a source/drain thereof serves as the first terminal of the first switch and the first terminal of the second switch, another source/drain serves as the second terminal of the first switch and the second terminal of the second switch, and a gate thereof serves as the control terminal of the first switch and the control terminal of the second switch.

25. The shift register apparatus according to claim 23, wherein each of the first switch and the second switch comprise an N-type amorphous silicon (a-Si) TFT, wherein a source/drain thereof serves as the first terminal of the first switch and the first terminal of the second switch, another source/drain thereof serves as the second terminal of the first switch and the second terminal of the second switch, and a gate thereof serves as the control terminal of the first switch and the control terminal of the second switch.

26. The shift register apparatus according to claim 23, wherein the power storage device comprises a capacitor having two terminals respectively serving as the first terminal and the second terminal of the power storage device.

27. The shift register apparatus according to claim 23, further comprising:
a second buffer circuit, coupled to the output terminal of the first buffer circuit, for maintaining the output terminal of the first buffer circuit at a non-floating status.

28. The shift register apparatus according to claim 27, wherein the second buffer circuit comprises:
a bias adjusting circuit, coupled to the output terminal of the first buffer circuit, for generating a bias signal according to an output of the first buffer circuit; and
a third switch having a first terminal coupled to the output terminal of the first buffer circuit, a second terminal coupled to the common potential and a control terminal for receiving the bias signal to determining a degree to conduct.

29. The shift register apparatus according to claim 28, wherein the bias adjusting circuit comprises:
a first impedance, having a first terminal and a second terminal, wherein the first terminal of the first impedance is coupled to the power source voltage;
a second impedance having a first terminal coupled to the second terminal of the first impedance and a second terminal coupled to the common potential;
a third impedance having a terminal coupled to the common potential; and
a fourth switch having a first terminal coupled to another terminal of the third impedance, a second terminal coupled to the first terminal of the second impedance for outputting the bias signal and a control terminal coupled to the output terminal of the first buffer circuit for determining whether or not to turn on according to the output of the first buffer circuit.

30. The shift register apparatus according to claim 29, wherein each of the third switch and the fourth switch comprise an N-type metal oxide semiconductor (NMOS) transistor, wherein a source/drain thereof serves as the first terminal of the third switch and the first terminal of the fourth switch, another source/drain thereof serves as the second terminal of the third switch and the second terminal of the fourth switch, and a gate thereof serves as the control terminal of the third switch and the control terminal of the fourth switch.

31. The shift register apparatus according to claim 29, wherein each of the third switch and the fourth switch comprise an N-type amorphous silicon (a-Si) TFT, wherein a source/drain thereof serves as the first terminal of the third switch and the first terminal of the fourth switch, another source/drain thereof serves as the second terminal of the third switch and the second terminal of the fourth switch, and a gate thereof serves as the control terminal of the third switch and the control terminal of the fourth switch.

* * * * *